United States Patent
Quick et al.

(10) Patent No.: US 7,268,063 B1
(45) Date of Patent: Sep. 11, 2007

(54) PROCESS FOR FABRICATING SEMICONDUCTOR COMPONENT

(75) Inventors: Nathaniel R. Quick, Lake Mary, FL (US); Aravinda Kar, Oviedo, FL (US); Islam A. Salama, Chandler, AZ (US)

(73) Assignee: University of Central Florida, Orlando, FL (US)

( * ) Notice: Subject to any disclaimer, the term of this patent is extended or adjusted under 35 U.S.C. 154(b) by 233 days.

(21) Appl. No.: 11/141,913

(22) Filed: Jun. 1, 2005

Related U.S. Application Data (60) Provisional application No. 60/575,851, filed on Jun. 1, 2004.

(51) Int. Cl.
*H01L 21/20* (2006.01)

(52) U.S. Cl. .................... 438/487; 438/478

(58) Field of Classification Search ............ 438/487, 438/662, 674, 675, 672
See application file for complete search history.

(56) References Cited

U.S. PATENT DOCUMENTS

| | | |
|---|---|---|
| 3,214,315 A | 10/1965 | Hildebrand |
| 3,396,401 A | 8/1968 | Nonomura |
| 3,419,321 A | 12/1968 | Barber et al. |
| 3,605,469 A | 9/1971 | Queralto |
| 3,788,120 A | 1/1974 | Takeo et al. |
| 3,854,123 A | 12/1974 | Banach |
| 3,865,564 A | 2/1975 | Jaeger et al. |
| 3,874,240 A | 4/1975 | Rembaum |
| 3,943,324 A | 3/1976 | Haggerty |
| 3,944,640 A | 3/1976 | Haggerty et al. |
| 3,945,318 A | 3/1976 | Landsman |
| 3,965,328 A | 6/1976 | Locke |
| 3,981,705 A | 9/1976 | Jaeger et al. |
| 4,043,170 A | 8/1977 | Erodi et al. |
| 4,135,902 A | 1/1979 | Oehrle |
| 4,142,088 A | 2/1979 | Hirsch |
| 4,159,414 A | 6/1979 | Suh et al. |
| 4,215,263 A | 7/1980 | Grey et al. |

(Continued)

FOREIGN PATENT DOCUMENTS

| | | |
|---|---|---|
| WO | WO 03013757 | 2/2003 |

OTHER PUBLICATIONS

K. G. Kreider, D.R.F. Burgess, Jr., M.J.Tarlov, G. Gillen and W. Wight, R. Lareau and L. M. Casas, "Laser Transformed SiC Thin Films," Materials Research Symposium Proceeding, vol. 339, 1994.

(Continued)

*Primary Examiner*—Matthew Smith
*Assistant Examiner*—Jae Lee
(74) *Attorney, Agent, or Firm*—Frijouf, Rust & Pyle P.A.

(57) ABSTRACT

A process is disclosed for in-situ fabricating a semiconductor component imbedded in a substrate. A substrate is ablated with a first laser beam to form a void therein. A first conductive element is formed in the void of the substrate with a second laser beam. A semiconductor material is deposited upon the first conductive element with a third laser beam operating in the presence of a depositing atmosphere. A second conductive element is formed on the first semiconductor material with a fourth laser beam. The process may be used for fabricating a Schottky barrier diode or a junction field effect transistor and the like.

15 Claims, 9 Drawing Sheets

U.S. PATENT DOCUMENTS

| | | | |
|---|---|---|---|
| 4,309,224 A | 1/1982 | Shibata |
| 4,339,285 A | 7/1982 | Pankove |
| 4,372,989 A | 2/1983 | Menzel |
| 4,383,843 A | 5/1983 | Iyengar |
| 4,496,607 A | 1/1985 | Mathias |
| 4,539,251 A | 9/1985 | Sugisawa et al. |
| 4,547,650 A | 10/1985 | Arditty et al. |
| 4,565,712 A | 1/1986 | Noguchi et al. |
| 4,620,264 A | 10/1986 | Ushifusa et al. |
| 4,624,934 A | 11/1986 | Kokubu et al. |
| 4,663,826 A | 5/1987 | Bauerle |
| 4,691,091 A | 9/1987 | Lyons et al. |
| 4,710,253 A | 12/1987 | Soszek |
| 4,761,339 A | 8/1988 | Komatsu et al. |
| 4,791,239 A | 12/1988 | Sirahata et al. |
| 4,840,853 A | 6/1989 | Lio et al. |
| 4,847,138 A | 7/1989 | Boylan et al. |
| 4,860,442 A | 8/1989 | Ainsworth et al. |
| 4,872,923 A | 10/1989 | Borodin |
| 4,880,770 A | 11/1989 | Mir et al. |
| 4,901,550 A | 2/1990 | Kolde |
| 4,912,087 A | 3/1990 | Aslam et al. |
| 4,924,033 A | 5/1990 | Iyogi et al. |
| 4,950,558 A | 8/1990 | Sarin |
| 4,962,085 A | 10/1990 | deBarbadillo, II et al. |
| 4,988,564 A | 1/1991 | D'Angelo et al. |
| 5,015,618 A | 5/1991 | Levinson |
| 5,055,967 A | 10/1991 | Sukonnik et al. |
| 5,127,364 A | 7/1992 | Savkar et al. |
| 5,145,741 A | 9/1992 | Quick |
| 5,149,681 A | 9/1992 | Ohkawa et al. |
| 5,180,440 A | 1/1993 | Siegel et al. |
| 5,336,360 A | 8/1994 | Nordine |
| 5,391,841 A | 2/1995 | Quick |
| 5,405,481 A | 4/1995 | Licoppe et al. |
| 5,459,098 A | 10/1995 | Maya |
| 5,493,096 A | 2/1996 | Koh |
| 5,549,971 A | 8/1996 | Nordine |
| 5,629,532 A | 5/1997 | Myrick |
| 5,680,200 A | 10/1997 | Sugaya et al. |
| 5,695,828 A | 12/1997 | Ghosh et al. |
| 5,733,609 A | 3/1998 | Wang |
| 5,754,299 A | 5/1998 | Sugaya et al. |
| 5,793,042 A | 8/1998 | Quick |
| 5,823,039 A | 10/1998 | Umeda et al. |
| 5,837,607 A * | 11/1998 | Quick ........................ 438/667 |
| 5,847,418 A | 12/1998 | Nakamura et al. |
| 5,889,234 A | 3/1999 | Ghosh et al. |
| 5,906,708 A | 5/1999 | Robinson et al. |
| 5,961,877 A | 10/1999 | Robinson et al. |
| 6,025,609 A | 2/2000 | Quick |
| 6,054,375 A | 4/2000 | Quick |
| 6,064,081 A | 5/2000 | Robinson et al. |
| 6,203,861 B1 | 3/2001 | Kar et al. |
| 6,221,154 B1 | 4/2001 | Lee et al. |
| 6,252,197 B1 | 6/2001 | Hoekstra et al. |
| 6,255,671 B1 | 7/2001 | Bojarczuk et al. |
| 6,271,576 B1 | 8/2001 | Quick |
| 6,274,234 B1 | 8/2001 | Dujardin et al. |
| 6,313,015 B1 | 11/2001 | Lee et al. |
| 6,334,939 B1 | 1/2002 | Zhou et al. |
| 6,407,443 B2 | 6/2002 | Chen et al. |
| 6,526,327 B2 | 2/2003 | Kar et al. |
| 6,621,448 B1 | 9/2003 | Lasky et al. |
| 6,670,693 B1 | 12/2003 | Quick |
| 6,732,562 B2 | 5/2004 | Quick et al. |
| 6,930,009 B1 | 8/2005 | Quick |
| 6,939,748 B1 | 9/2005 | Quick |

OTHER PUBLICATIONS

D.K. Sengupta, N. R. Quick and A. Kar, "Laser Direct Write of Conducting and Insulating Tracks in Silicone Carbide," Materials Research Society Symposium Proceedings, vol. 624, 1999.

D.K. Sengupta, N. R. Quick and A. Kar, "Laser Synthesis of Ohmic Contacts in Silicone Carbide Having Schottky Diode Characteristics Before Laser Treatment", 2001.

D.K. Sengupta, N. R. Quick and A. Kar, "Laser Conversion of Electrical Properties for Silicon Carbide Device Applications," Journal of Laser Applications. p. 26, vol. 13, No. 1, Feb. 2001.

Nathaniel R. Quick, "Laser Synthesis of Conductive Phases In Silicone Carbide and Aluminum Nitride," The Minerals, Metals & Materials Society, 1995.

* cited by examiner

PROCESS FOR FABRICATING SEMICONDUCTOR COMPONENT

CROSS-REFERENCE TO RELATED APPLICATIONS

This application claims benefit of U.S. patent Provisional application Ser. No. 60/575,851 filed Jun. 1, 2004. All subject matter set forth in provisional application Ser. No. 60/575,851 is hereby incorporated by reference into the present application as if fully set forth herein.

BACKGROUND OF THE INVENTION

1. Field of the Invention

This invention relates to the fabrication of semiconductor components and more particularly to the in-situ fabrication of semiconductor components imbedded within a substrate through a laser synthesis process.

2. Description of the Related Art

Certain ceramics, such as silicon carbide (SiC) and aluminum nitride (AlN), are known to exhibit Certain ceramics, such as silicon carbide (SiC) and aluminum nitride (AlN), are known to exhibit electrical properties ranging including insulating properties, semiconducting properties as well as conducting properties. It is well known alumina (Al2O3) dominates the dielectric market as an integrating substrate or device carrier in electronics packaging. BN, AlN, SiC and diamond are also of interest, due to the thermal coefficient of expansion (TCE) and for the dielectric constant and higher thermal conductivity than that of Al2O3. SiC, AlN, BN, GaN and diamond also exhibit a wide-band gap and chemical resistance as well as exhibiting properties from a semiconductor to an insulator. These properties are of substantial interest for high temperature applications approaching 1000° C. and for aggressive environment applications. In addition, these properties are desirable for high density integrated circuit packing.

In the prior art, metallization methods, including dry-film imaging and screen printing have been used for the production of conductive patterns on alumina. However, metal compatibility difficulties with high thermal conductivity ceramic materials such as AlN and SiC, have not been completely solved. Copper and silver paste exhibits a TCE mismatch aggravated by high temperatures as well as being subject to oxidation that increases the resistivity. In particular, bonding of copper to AlN has proved to be nontrivial. A lumina or stoichiometric aluminum oxynitride (AlON) coatings must be developed on the AlN surface through passivation processes. These passivation processes have poor reproducibility. Thus, the direct laser synthesis of conductors in AlN, SiC and diamond substrates appears to provide solutions to this long standing prior art problem with regard to metallization and for more simple processing techniques for creating devices and circuitry that are compatible with selected ceramic substrates, while satisfying the need for higher temperature, aggressive environment, and higher density integrated circuit packaging applications. The following U.S. patents illustrate apparatuses and methods represent some of the attempts of the prior art for developing conductor and semiconductor components.

U.S. Pat. No. 5,906,708 to Robinson et al discloses silicon-germanium-based compositions comprising silicon, germanium, and carbon (Si—Ge—C), methods for growing Si—Ge—C epitaxial layer(s) on a substrate, etchants especially suitable for Si—Ge—C etch-stops, and novel methods of use for Si—Ge—C compositions. In particular, the invention relates to Si—Ge—C compositions, especially for use as etch-stops and related processes and etchants useful for microelectronic and nanotechnology fabrication.

U.S. Pat. No. 5,961,877 to Robinson et al discloses silicon-germanium-based compositions comprising silicon, germanium, and carbon Si—Ge—C, methods for growing Si—Ge—C epitaxial layer(s) on a substrate, etchants especially suitable for Si—Ge—C etch-stops, and novel methods of use for Si—Ge—C compositions. In particular, the invention relates to Si—Ge—C compositions, especially for use as etch-stops and related processes and etchants useful for microelectronic and nanotechnology fabrication.

U.S. Pat. No. 6,064,081 to Robinson et al discloses silicon-germanium-based compositions comprising silicon, germanium, and carbon (Si—Ge—C), methods for growing Si—Ge—C epitaxial layer(s) on a substrate, etchants especially suitable for Si—Ge—C etch-stops, and novel methods of use for Si—Ge—C compositions. In particular, the invention relates to Si—Ge—C compositions, especially for use as etch-stops and related processes and etchants useful for microelectronic and nanotechnology fabrication.

U.S. Pat. No. 6,221,154 to Lee et al. discloses a method and an apparatus developed to grow beta-silicon carbide nanorods, and prepare patterned field-emitters using different kinds of chemical vapor deposition methods. The apparatus includes graphite powder as the carbon source, and silicon powder as silicon sources. Metal powders (Fe, Cr and/or Ni) are used as catalyst. Hydrogen was the only feeding gas to the system.

U.S. Pat. No. 6,274,234 to Dujardin et al. discloses atomic wires of great length and great stability formed on the surface of a SiC substrate as straight chains of dimers of an element chosen from amongst SiC and C. In order to produce same, layers of the element are formed on the surface and the assembly is constructed by means of annealings of the surface provided with the layers. The resulting wires have application to nanoelectronics.

U.S. Pat. No. 6,313,015 to Lee et al. discloses silicon nanowires and silicon nanoparticle chains formed by the activation of silicon monoxide in the vapor phase. The silicon monoxide source may be solid or gaseous, and the activation may be by thermal excitation, laser ablation, plasma or magnetron sputtering. The present invention produces large amounts of silicon nanowires without requiring the use of any catalysts that may cause contamination.

U.S. Pat. No. 6,334,939 to Zhou et al. discloses a nanostructure based material capable of accepting and reacting with an alkali metal such as lithium. The material exhibits a reversible capacity ranging from at least approximately 900 mAh/g–1,500 mAh/g. The high capacity of the material makes it attractive for a number of applications, such as a battery electrode material.

U.S. Pat. No. 6,407,443 to Chen et al. discloses a method for forming a platen useful for forming nanoscale wires for device applications comprising: (a) providing a substrate having a major surface; (b) forming a plurality of alternating layers of two dissimilar materials on the substrate to form a stack having a major surface parallel to that of the substrate; (c) cleaving the stack normal to its major surface to expose the plurality of alternating layers; and (d) etching the exposed plurality of alternating layers to a chosen depth using an etchant that etches one material at a different rate than the other material to thereby provide the surface with extensive strips of indentations and form the platen useful for molding masters for nano-imprinting technology. The pattern of the platen is then imprinted into a substrate comprising a softer material to form a negative of the pattern, which is then used in further processing to form nanowires. The nanoscale platen thus comprises a plurality of alternating layers of the two dissimilar materials, with the layers of one material etched relative to the layers of the other material to form indentations of the one material. The platen is then oriented such that the indentations are perpendicular to a surface to be imprinted.

In the prior United States patents of one of the inventors of the present invention, Dr. Nathanial R. Quick disclosed various processes for forming diverse types of apertures or vias, conductors, semiconductors, insulators and semiconductor components within a wide band gap semiconductor substrate. Many of these processes incorporated the laser synthesis of a wide-bandgap semiconductor substrate.

The prior patents of Dr. Nathanial R. Quick include the following United States Letters patent, namely U.S. Pat. No. 5,145,741, U.S. Pat. No. 5,391,841, U.S. Pat. No. 5,837,607, U.S. Pat. No. 6,025,609, U.S. Pat. No. 6,054,375 and U.S. Pat. No. 6,271,576.

It is a primary object of the present invention to provide further process for fabricating semiconductor components based on the previous inventions of Dr. Nathanial R. Quick.

Another object of this invention is to provide an improved process for fabricating semiconductor components that locates a component and orients the semiconductor components Another object of this invention is to provide an improved process for fabricating semiconductor components such as diodes, field effect transistors and the like.

Another object of this invention is to provide an improved process for fabricating semiconductor components with enhanced high frequency and high power performance.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention and the detailed description describing the preferred embodiment of the invention.

SUMMARY OF THE INVENTION

A specific embodiment of the present invention is shown in the attached drawings. For the purpose of summarizing the invention, the invention relates to an improved process for in-situ fabricating a semiconductor component in a substrate. A substrate is ablated with a first laser beam to form a void therein. A first conductive element is formed in the void of the substrate with a second laser beam. A semiconductor material is deposited upon the first conductive element with a third laser beam operating in the presence of a depositing atmosphere. A second conductive element is formed on the first semiconductor material with a fourth laser beam. The process may be used for fabricating a Schottky barrier diode or a junction field effect transistor and the like.

In a more specific embodiment of the invention, a first laser beam is directed onto the substrate for ablating the substrate to form a void. A second laser beam is directed within the void for forming a first conductive element. A third laser beam is directed within the void in the presence of a first depositing atmosphere for depositing a first semiconductor material upon the first conductive element to accumulate within the void with the first semiconductor material. A fourth laser beam is directed onto the second semiconductor material for forming a second conductive element in electrical contact with the first semiconductor material.

In another embodiment of the invention, the invention relates to an improved process of fabricating a semiconductor component in a substrate. A first laser beam is directed onto the substrate for ablating the substrate to form a void. A second laser beam is directed within the void for forming a first conductive element. A third laser beam is directed within the void in the presence of a first depositing atmosphere for depositing a first semiconductor material upon the first conductive element to accumulate within the void with the first semiconductor material. A fourth laser beam is directed within the void in the presence of a second depositing atmosphere for depositing a second semiconductor material upon the first semiconductor material to accumulate within the void. A fifth laser beam is directed onto the second semiconductor material for forming a second conductive element.

The foregoing has outlined rather broadly the more pertinent and important features of the present invention in order that the detailed description that follows may be better understood so that the present contribution to the art can be more fully appreciated. Additional features of the invention will be described hereinafter which form the subject matter of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention.

BRIEF DESCRIPTION OF THE DRAWINGS

For a fuller understanding of the nature and objects of the invention, reference should be made to the following detailed description taken in connection with the accompanying drawings in which.

Similar reference characters refer to similar parts throughout the several Figures of the drawings.

DETAILED DISCUSSION

Figure 1:
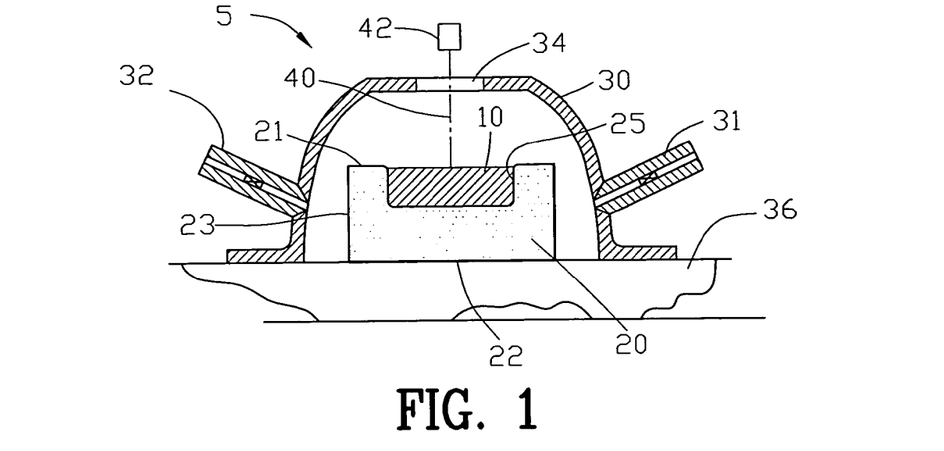
FIG. 1 is a side view of an air-tight chamber with a thermal energy beam impinging on a semiconductor substrate for forming a semiconductor component in a substrate.

FIG. 1 is a side view of an apparatus 5 for in-situ forming a semiconductor component 10 in a semiconductor substrate 20. The semiconductor substrate 20 is shown located in an air-tight chamber 30. The chamber 30 has an inlet and valve combination 31 and outlet and valve combination 32 connected to the side wall of the chamber 30 for injecting and removing gases into and therefrom, respectively. The chamber 30 includes an airtight laser beam transmission window 34 disposed for transmitting a laser beam into the chamber 30. The chamber 30 is dispose on a support member 36 forming an airtight seal therewith.

The semiconductor substrate 20 defines a first and a second side 21 and 22 and a peripheral edge 23. Although the semiconductor substrate 20 is shown as a square, the present invention is not limited by the physical configuration of the semiconductor substrate 20 as shown herein. The semiconductor substrate 20 may be formed as a monolith or a thin film substrate having suitable properties for forming the semiconductor component 10 in the semiconductor substrate 20.

A thermal energy beam 40 is shown emanating from a source 42 to impinge on the first surface 21 of the semiconductor substrate 20 for forming the semiconductor component 10. In one example, the thermal energy beam 40 is a beam of charged particles such as a beam of electrons or a beam of ions. The source 42 of the beam of charged particles is located within the chamber 40. In another example, the thermal energy beam 40 is a beam of electromagnetic radiation such as a laser beam. Examples of a suitable source of the laser beam include a Nd:YAG laser, a frequency double $2\overline{\omega}$, Nd:YAG laser or an Excimer laser. The source 42 of the beam of electromagnetic radiation may be located outside of the chamber 30 and being transferred through the airtight laser beam transmission window 34.

Figure 2:
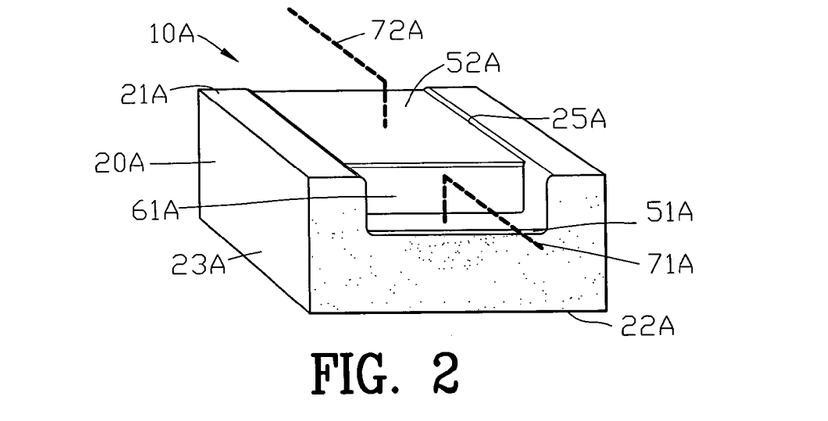
FIG. 2 is an enlarged isometric view of a first example of the semiconductor component formed in the substrate through the process of FIG. 1.

FIG. 2 is an enlarged isometric view of a first example of the semiconductor component 10A formed by the process shown in FIG. 1. In this example, the semiconductor component 10A is a nanosize semiconductor diode shown as a Schottky barrier diode. Although the semiconductor component 10A has been shown as a Schottky barrier diode, it should be understood that the present process may be used for fabricating various types of semiconductor component 10A.

The semiconductor substrate 20A defines a first and a second side 21A and 22A and a peripheral edge 23A with the semiconductor component 10A formed within the void 25A. The semiconductor component 10A comprises a first and a second conductive element 51A and 52A. The first conductive element 51A forms an Ohmic connection with one side of the first type of semiconductor material 61A. The second conductive element 52A forms a barrier junction with the other side of the first type of semiconductor material 61A. Electrical connectors 71A and 72A are affixed to the first and second conductive elements 51A and 52A, respectively.

Figure 3:
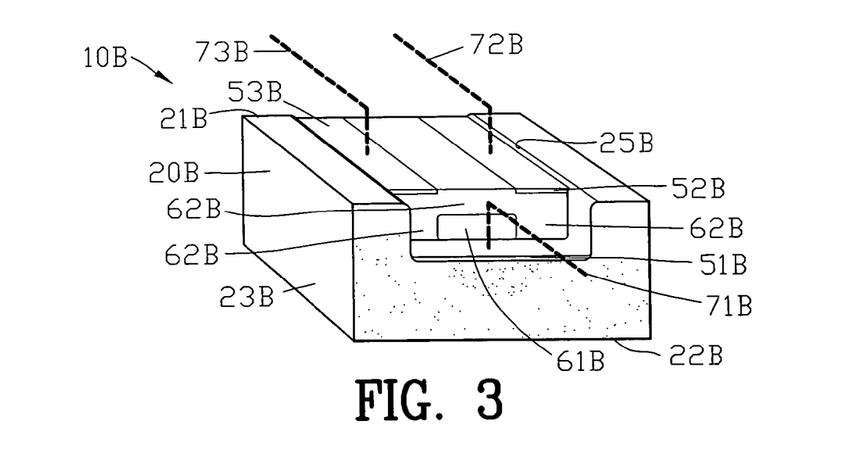
FIG. 3 is an enlarged isometric view of a second example of the semiconductor component formed in the substrate through the process of FIG. 1.

FIG. 3 is an enlarged view of a second example of the semiconductor component 10B formed by the process shown in FIG. 1. In this example, the semiconductor component 10B is a nanosize semiconductor transistor shown as a junction field effect transistor (JFET). Although the semiconductor component 10B has been shown as a junction field effect transistor (JFET), it should be understood that the present process may be used for fabricating various types of semiconductor component 10B.

The semiconductor substrate 20B defines a first and a second side 21B and 22B and a peripheral edge 23B with the semiconductor component 10B formed within the void 25B. The semiconductor component 10B comprises a first, a second and a third conductive element 51B, 52B and 53B. The first conductive element 51B forms an ohmic connection with the first type of semiconductor material 61B. The second and third conductive elements 52B and 53B form ohmic connections with the second type of semiconductor material 62B. The first conductive element 51B is connected to a gate of the junction field effect transistor (JFET) 10B whereas the second and third conductive elements 52B and 53B are connected to a source and a drain of the junction field effect transistor (JFET) 10B. Electrical connectors 71A, 72A and 73A are affixed to the first, second and third conductive elements 51A, 52A and 53A, respectively.

FIGS. 4–9 illustrate the process steps of forming the semiconductor component 10A shown in FIG. 2. The semiconductor component 10A is formed in situ by a laser synthesis process shown in FIG. 1. It should be appreciated that the apparatus of FIG. 1 may be used with various types of semiconductor substrate materials and various types of doping and/or depositing atmospheres.

The term "laser synthesis" and "laser synthesized" is used to broadly define the rapid thermal heating and/or melting and the rapid cooling and/or solidification of a selected area of the semiconductor substrate by a laser beam to cause a change in the chemical, electrical and/or physical change to selected area of the semiconductor substrate. The thermal heating and/or melting by the laser beam may be accompanied by the use of gases, such as air, oxygen or other gas/vapor mixtures to cause further changes in the chemical, electrical and/or physical change to selected area of the semiconductor substrate.

Figure 4:
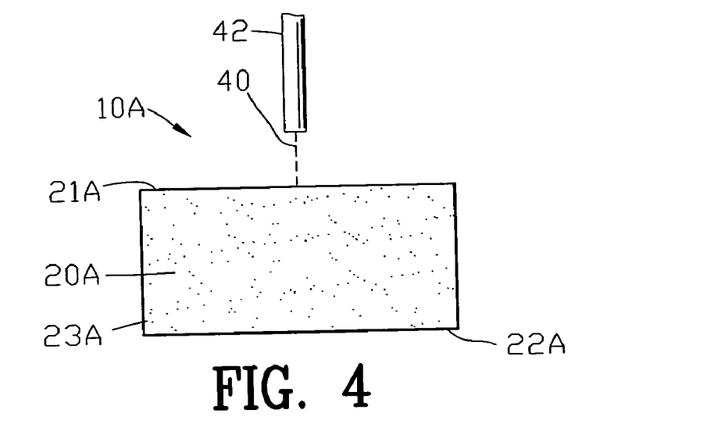
FIG. 4 is a first step in the process of forming the semiconductor component of FIG. 2 illustrating a first laser beam directed onto the substrate.

FIG. 4 is a first step in the process of forming the semiconductor component 10A of FIG. 2 illustrating a first laser beam 40 directed onto the substrate 20A. The semiconductor component 10A is formed within a semiconductor substrate 20A. Preferably, the semiconductor substrate 20 has a bandgap greater than 2.0 electron volts. In one example, the semiconductor substrate 20 is selected from the IV group of the periodic table and having bandgap greater than 2.0 electron volts.

In still a more specific example of the invention, the semiconductor substrate 20A may be essentially a single crystal compound. The elements of the single crystal compound selected are from the III group and the V group of the periodic table and having bandgap greater than 2.0 electron volts. Preferably, one element of the compound has a higher melting point element than the other element of the compound. Specific examples of the wide-bandgap semiconductor compound are selected from the group consisting of Aluminum Nitride, Silicon Carbide, Boron Nitride, Gallium Nitride and diamond.

In this example the semiconductor substrate 20A is shown as a semi-insulating or insulating vanadium doped silicon carbide wafer. The vanadium doped silicon carbide wafer may be formed through a laser doping process using a metal-organic atmosphere to provide a source for the vanadium doping.

Figure 5:
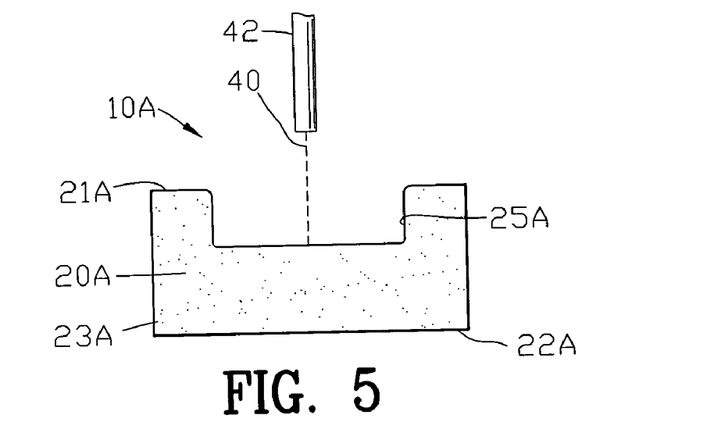
FIG. 5 is a second step in the process of forming the semiconductor component of FIG. 2 illustrating the ablation of the substrate to form a void therein.

FIG. 5 is a second step in the process of forming the semiconductor component 10A of FIG. 2 illustrating the ablation of the semiconductor substrate 20A to form a void 25A therein. The step of ablating comprises directing a first laser beam 40 onto the semiconductor substrate 20A to form a void 25A within the semiconductor substrate 20A. Preferably, the process of ablating the semiconductor substrate 20A converts a portion of the semiconductor substrate material 20A directly into a gas phase by evaporation and/or sublimation.

The following is an example of the parameters used for forming the void 25A within the semiconductor substrate 20A. The void 25A was formed in an inert atmosphere such as argon or in a vacuum.

EXAMPLE I

A complete conversion of silicon carbide to the gas phase is accomplished at temperatures equal to or greater than 3500° C. Nd:YAG laser operating at 1064 nm wavelength, 2 KHz pulse repetition rate, 42 watts power, 0.025 cm beam diameter for the ablation process of silicon carbide. A volume of $3 \times 10^{-5}$ cc can be removed in 5 seconds from a 0.0635 cm thick silicon carbide wafer (vanadium doped) substrate. This ablation process yields an ablation rate of $6 \times 10^{-6}$ cc/sec. An ablation rate of $6 \times 10^{-6}$ cc/sec. corresponds to a power density (intensity) of 5350 W/cm2 at a pulse repetition rate of 2 KHz.

Preferably, an excimer laser in the range 157 nm–351 nm (Lambda Physik) is used in the ablation process since structural dimensions of the semiconductor component 10A are limited to one half (½) of the laser wavelength. The excimer laser enables structural dimensions of the semiconductor component 10A to be reduced to 80–175 nm. It should be appreciated by those skilled in the art that other optical devices such as diffractive optical elements and the like can further reduce the size of structural dimensions of the semiconductor component 10A as is well know in the art.

Figure 6:
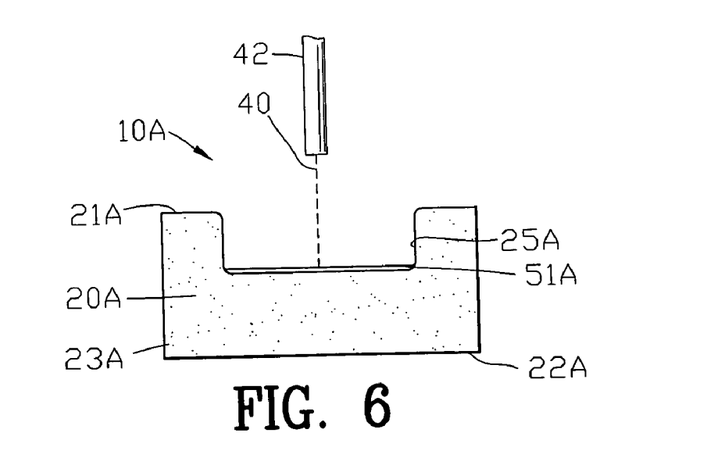
FIG. 6 is a third step in the process of forming the semiconductor component of FIG. 2 illustrating a second laser beam directed into the void for forming a first conductive element.

FIG. 6 is a third step in the process of forming the semiconductor component 10A of FIG. 2 illustrating a second laser beam 40 directed into the void 25A for forming a first conductive element 51A. The conductive element 51A is formed by directing a thermal energy beam onto the semiconductor substrate 20A to heat a region for changing the structure of the semiconductor substrate 20A into the conductive element 51A. The exact mechanism of forming the conductive element 51A within the semiconductor 20A is not fully understood at this time. One theory of the mechanism of forming the conductive element 51A comprises the transformation of either a single crystal semiconductor 20A or an aligned polycrystalline semiconductor 20A to a carbon rich silicon carbide phase.

It is believed the thermal energy beam 40 changes the crystal structure of a semiconductor substrate 20A formed as a single crystal or an aligned polycrystalline elemental material to provide the conductive element 51A. It is further believed the thermal energy beam 40 increasing the concentration of the higher melting point element of a single crystal or an aligned polycrystalline compound material to provide the conductive element 51A. In the example of silicon carbide, the higher melting point element carbon of the silicon carbide provides the conductive element 51A. The conductive element 51A has conductive properties less than 10−2 ohm-cm.

The following is an example of the parameters used for forming the conductive element 51 in FIG. 6. The conductive element 51 was formed in an atmosphere of nitrogen but it should be understood the conductive element 51 may be formed in other atmospheres including argon and the like.

EXAMPLE II

4H-Silicon Carbide single crystal substrate was irradiated with Nd:YAG, 1064 nm wavelength emisson, having a 260 ns pulse width, 35 kHz pulse repetition rate Q-switched laser, using an optimal power of 69.3 W. The 4H-Silicon Carbide single crystal substrate was positioned in an air-tight chamber with an atmosphere of Nitrogen gas. The laser beam was transmitted through a soda-lime glass window. Beam scanning was achieved either by a galvo-mirror or an x-y programmable table. Nanoribbon conductors having a nano-polycrystalline structure, as analyzed by high resolution transmission electron microscopy (Techni F30) using selected area electron diffraction (SAED) after focused ion beam milling, were formed within the substrate using an optimal intensity of 8820 W/cm$^2$ in a nitrogen environment. The heating rate and cooling rate was approximately a factor of 10 (an order or magnitude) than for micro-conductors formed in the prior art. The intensity used for the micro-conductors was 1003 W/cm$^2$. These process conditions resulted in a laser-material interaction time greater than 0.01 sec. The nano-ribbon conductors formed a heterostructure having a carbon atomic % ranging from 75–100% and a resistivity less than 10$^{-2}$ ohm-cm. The nano-ribbon conductors formed in bundles 50–60 nm thick incorporating 15–17 layers.

A more through discussion for forming the conductive element 51 within the semiconductor substrate 20A is set forth in U.S. patent application Ser. No. 10/262,310 filed Sep. 30, 2002 the disclosure of which is hereby incorporated by reference into the present application as if fully set forth herein.

Figure 7:
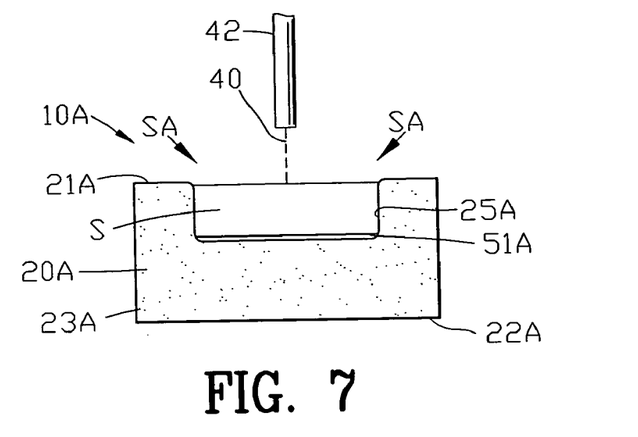
FIG. 7 is a fourth step in the process of forming the semiconductor component of FIG. 2 illustrating a third laser beam directed into the void in the presence of a depositing atmosphere for depositing a semiconductor material upon the first conductive element to accumulate within the void.

FIG. 7 is a fourth step in the process of forming the semiconductor component 10A of FIG. 2 illustrating a third laser beam directed into the void 25A in the presence of a first depositing atmosphere (SA) for depositing a first semiconductor material S upon the first conductive element 51A to accumulate within the void 25A.

The step of depositing a semiconductor material S upon the first conductive element 51A comprises directing a third laser beam within the void 25A in the presence of a first depositing atmosphere SA for depositing the semiconductor material S upon the first conductive element 51A to accumulate within the void 25A. In the example of silicon carbide, intrinsic silicon carbide semiconductor accumulates within the void 25A of the semiconductor substrate 20A.

The semiconductor material S is added within the void 25A by directing the laser beam onto a selected portion of the void 25A of the semiconductor substrate in the presence of a depositing gas SA. The laser beam heats the selected portion of the semiconductor substrate 20A as well as heating and/or dissociating the depositing gas SA. The heated and/or dissociated depositing gas component interacts with the heated selected portion of the semiconductor substrate 20A to promote the growth of crystal of the semiconductor material (s) within the void.

The following is a specific example of the depositing a semiconductor material S upon the first conductive element 51A comprises directing a third laser beam within the void 25A.

EXAMPLE IV

A gas such as tetramethylsilane (TMS) or diethylsilane (DES), single gas sources for both carbon and silicon or gaseous mixtures of silane (a source for silicon) and methane or acetylene (sources for carbon) are used. TMS and DES type sources are preferred. The laser dissociates the gas(es) and directs the deposition of silicon and carbon. This is a maskless process. Laser power densities on the order of 100 W/cm$^2$ are used, which are an order of magnitude less than those used for synthesis, doping and ablation. Deposition rates as high as 4.5×10$^{-3}$ cm/s in the area of the beam are obtained (ref: J. V. Thompkins et al, Advances in Selective Area Laser Deposition of Silicon Carbide", Solid Freeform Fabrication Proceedings, 1994, pp. 412–421.)

Figure 8:
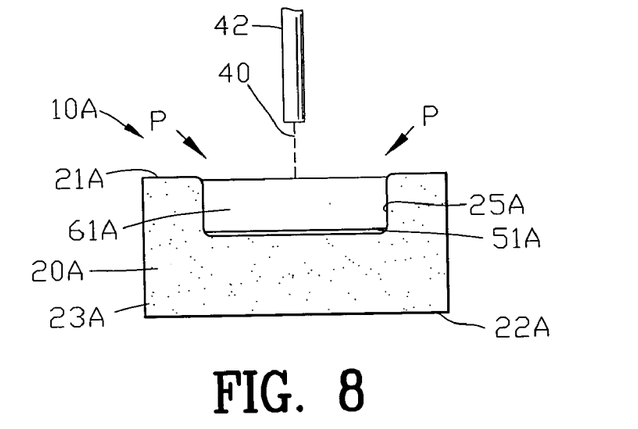
FIG. 8 is a fifth step in the process of forming the semiconductor component of FIG. 2 illustrating a fourth laser beam directed into the deposited semiconductor material in the presence of a doping atmosphere for converting the deposited semiconductor material into a first type of semiconductor.

FIG. 8 is a fifth step in the process of forming the semiconductor component 10A of FIG. 2 illustrating the step of converting the deposited semiconductor material S into a first type of semiconductor 61A. The step of converting the deposited semiconductor material S into the first type of semiconductor 61A comprises directing a fourth laser beam into the deposited semiconductor material S in the presence of a doping atmosphere N for converting the deposited semiconductor material S into a first type of semiconductor 61A.

The deposited semiconductor material S may be doped by directing the laser beam 40 onto a selected portion of the deposited semiconductor material S in the presence of a doping gas N. The laser beam 40 heats the selected portion of the deposited semiconductor material S as well as heating and/or dissociating the doping gas N. The heated and/or dissociated doping gas component diffuses into the heated selected portion of the deposited semiconductor material S to create a specific type of the doped semiconductor material 61A.

A chemical doping during the laser synthesis or conversion process may enhance the change in the chemical, electrical and/or physical properties of the semiconductor substrate 20A. The doping process occurs within the chamber 30 of FIG. 1 simultaneously with the irradiating by the laser beam 40 of selected areas of the semiconductor substrate 20A. The laser beam 40 causes the doping gas N to chemically disassociate and diffuse into the selected areas of the semiconductor substrate 20A. The combination of the irradiation by the laser beam 40 and the diffusion of a doping gas N cause chemical, electrical and physical changes in the properties of the semiconductor substrate 20A.

In the example of Silicon Carbide, a nitrogen doping gas the deposited semiconductor material S results in a N-type semiconductor material 61A. Although the FIG. 8 sets forth a separate process step of doping the deposited semiconductor material S, it should be understood that the process step of doping the deposited semiconductor material S may be accomplished simultaneously with the process step of depositing the semiconductor material S upon the first conductive element 51A shown in FIG. 7. In the case of Silicon Carbide, the process sets of FIGS. 7 and 8 may be accomplished simultaneously by mixing a nitrogen gas with a metal-organic gas.

The following is an example of the dopants and materials generated by a laser synthesis process of the present invention.

EXAMPLE III

DOPANTS AND MATERIALS GENERATED BY LASER SYNTHESIS

| Dopant Source | Dopant | RESULTANT MATERIALS (No Oxygen Present) | RESULTANT MATERIALS (No Oxygen Present) |
|---|---|---|---|
| | | Aluminum Nitride | Silicon Carbide |
| Di-Borane | Boron | Boron | Boron (p-type) |
| | | Boron Nitride(s) | Boron Carbide(i) |
| | | Aluminum Boride | |
| Silane | Silicon | Silicon(s) | Silicon(s) |
| | | Silicon Nitride(i) | Silicon Carbide(s) |
| Phosphine | Phosphorous | Phosphorous | Phosphorous(n-type) |
| Titanium tetra chloride | Titanium | Titanium(c) | Titanium(s) |
| | | Aluminum-Phosphide(s) | Boron |
| Titanium ethoxide | | Titanium nitride(c) | Titanium Silicide(s) |
| | | Titanium Aluminide(c) | Titanium Carbide |
| Aluminum sec-butoxide | Aluminum | Aluminum | Aluminum(p-type) |
| | | Aluminum Nitride(s) | Aluminum Carbide |
| Tetra Carbonyl Nickel | Nickel | Nickel | Nickel(c) |
| | | Nickel Aluminide(c) | Nickel Carbide |
| | | | Nickel Sulicide |
| Tungsten hexa-fluoride | Tungsten | Tungsten | Tungsten(c) |
| | | Tungsten Nitride | Tungsten-Carbide(c) |
| | | | Tungsten |
| Nitrogen | Nitrogen | Nitrogen | Nitrogen (n-type) |
| Trimethyl-aluminum | Aluminum | Aluminum | Aluminum (p-type) |
| Vanadium tris-acetyl-acetonate | Vanadium | Vanadium | Vanadium (semi-insulating) |

A more through discussion for doping a first semiconductor material 61A is set forth in U.S. Pat. No. 5,145,741, U.S. Pat. No. 5,391,841, U.S. Pat. No. 5,837,607, U.S. Pat. No. 6,025,609, U.S. Pat. No. 6,054,375 and U.S. Pat. No. 6,271,576 the disclosure of which is hereby incorporated by reference into the present application as if fully set forth herein.

Figure 9:
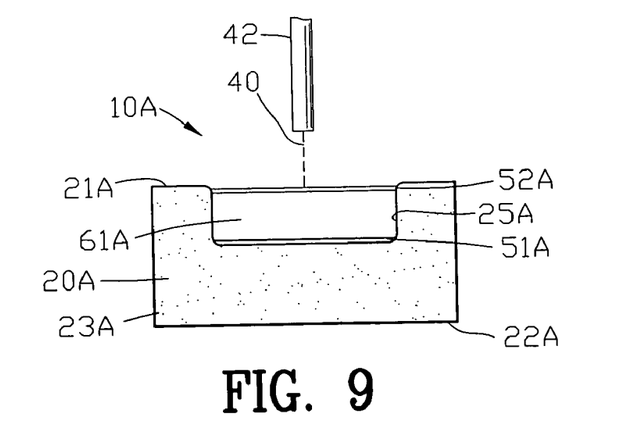
FIG. 9 is a sixth step in the process of forming the semiconductor component of FIG. 2 illustrating a fifth laser beam directed onto the converted semiconductor material for forming a second conductive element.

FIG. 9 is a sixth step in the process of forming the semiconductor component of FIG. 2 illustrating the forming a second conductive element 52A upon the converted semiconductor material 61A. The process of forming a second conductive element 52A comprises directing a fifth laser beam onto the converted semiconductor material 61A for forming a second conductive element 52A. The process of forming the second conductive element 52A upon the converted semiconductor material 61A is similar to the process of forming the first conductive element 51A within the void 25A as previously set forth with reference to FIG. 6.

In contrast to the Ohmic connection between the first conductive element 51A and the first semiconductor material 61A, a barrier junction is created between the second conductive element 52A and the first semiconductor material 61A. The control of the laser intensity, laser duration and the dopants during the formation of the first semiconductor material 61A creates the barrier junction between the second conductive element 52A and the first semiconductor material 61A. The barrier junction creates a Schottky barrier diode. In the case of Silicon Carbide, an enhanced rectifying barrier junction is formed directly by appropriate selection of laser parameters to create a silicon rich phase or by directing a fifth laser beam onto the converted semiconductor material 61A in the presence of a doping material such as a silane gas for forming a second conductive element 52A.

The completed semiconductor component 10 is shown in FIG. 2. The electrical connectors 71 and 72 are shown affixed to the first and second conductive elements 51A and 52A, respectively. The first conductive elements 51A extends beyond the semiconductor material 61A for facilitating the connection of the electrical connector 71 to the first conductive element 51A. Although the semiconductor component 10A has been shown as a diode, it should be understood that the present process can be used for fabricating various types of semiconductor component 10A.

The length of the first semiconductor material 61A and conductive elements 51A and 52A controls the power handling capacity of the semiconductor component 10A. The length of the first semiconductor material 61A can range from nanometers to any size limited only by the size of the semiconductor substrate 20A. The length of the first semiconductor material 61A and conductive elements 51A and 52A may take various geometrical forms such as a linear geometrical form, a curved geometrical form, a serpentine geometrical form and the like. Furthermore, the first semiconductor material 61A and conductive elements 51A and 52A may extend on multiple surfaces of the semiconductor substrate 20A.

FIGS. 10–18 illustrate the process steps of forming the semiconductor component 10B shown in FIG. 3. The semiconductor component 10B is formed by a laser synthesis the process shown in FIG. 1. The semiconductor component 10B is a nanosize semiconductor transistor shown as a junction field effect transistor (JFET) but it should be understood that the present process may be used for fabricating various types of semiconductor component 10B.

Figure 10:
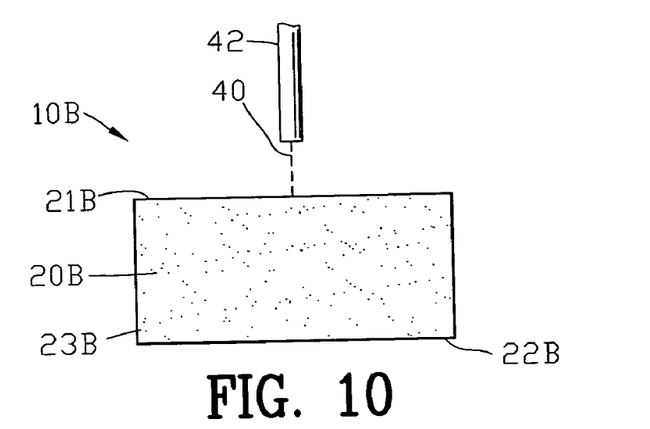
FIG. 10 is a first step in the process of forming the semiconductor component of FIG. 3 illustrating a first laser beam directed onto the substrate.

FIG. 10 is a first step in the process of forming the semiconductor component 10B of FIG. 3 illustrating a first laser beam 40 directed onto the semiconductor substrate 20B. The semiconductor substrate 20B may have the same chemical, electrical and/or physical properties as the semiconductor substrate 20A shown in FIGS. 4–9.

Figure 11:
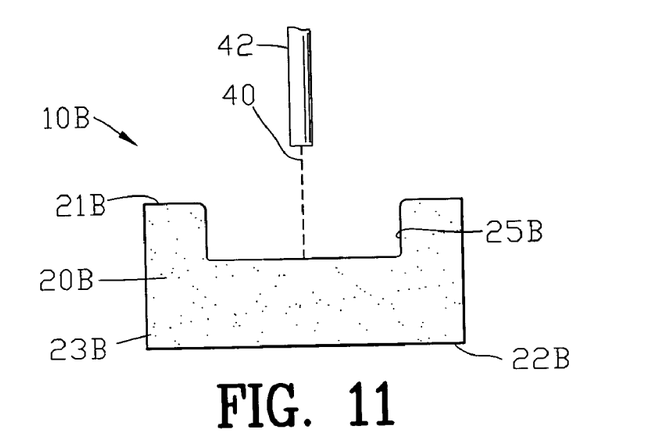
FIG. 11 is a second step in the process of forming the semiconductor component of FIG. 3 illustrating the ablation of the substrate to form a void therein.

FIG. 11 is a second step in the process of forming the semiconductor component 10B of FIG. 3 illustrating the ablation of the semiconductor substrate 20B to form a void 25B therein. The step of ablating comprises directing a first laser beam 40 onto the semiconductor substrate 20B to form a void 25B within the semiconductor substrate 20B. The process of ablating the semiconductor substrate 20B of FIG. 11 is substantially similar to the process of ablating the semiconductor substrate 20A shown in FIG. 5.

Figure 12:
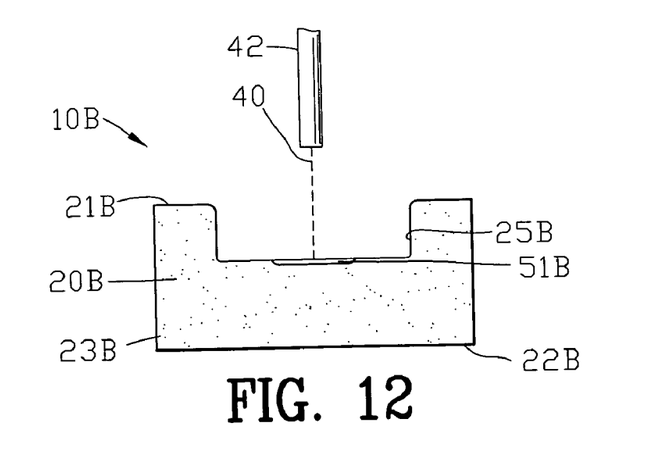
FIG. 12 is a third step in the process of forming the semiconductor component of FIG. 3 illustrating a second laser beam directed into the void for forming a first conductive element.

FIG. 12 is a third step in the process of forming the semiconductor component 10B of FIG. 3 illustrating a second laser beam 40 directed into the void 25B for forming a first conductive element 51B. The conductive element 51B is formed by directing a thermal energy beam onto the semiconductor substrate 20B to heat a region for changing the structure of the semiconductor substrate 20B into the conductive element 51B. The process of forming the first conductive element 51B of FIG. 12 is substantially similar to the process of forming the first conductive element 51A of FIG. 6. In contrast to FIG. 6, the first conductive element 51B of FIG. 12 extends only partially along the length of the void 25B.

Figure 13:
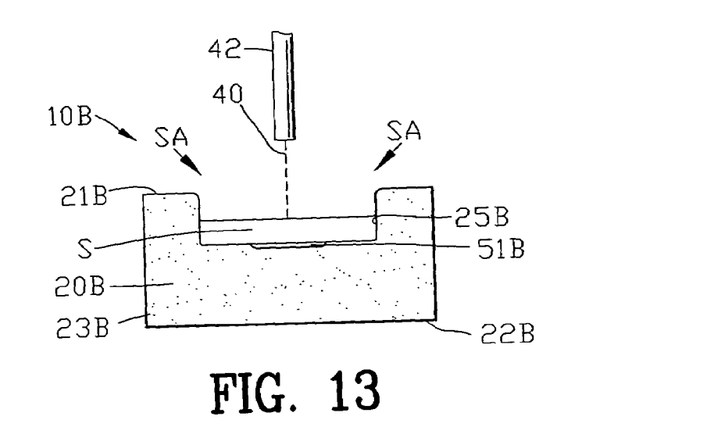
FIG. 13 is a fourth step in the process of forming the semiconductor component of FIG. 3 illustrating a third laser beam directed into the void in the presence of a first depositing atmosphere for depositing a first semiconductor material upon the first conductive element to accumulate within the void.

FIG. 13 is a fourth step in the process of forming the semiconductor component of FIG. 3 illustrating a third laser beam directed into the void 25B in the presence of a first depositing atmosphere (SA) for depositing a first semiconductor material S upon the first conductive element 51B to accumulate within the void 25B.

The step of depositing the first semiconductor material (S) upon the first conductive element 51B comprises directing a third laser beam within the void 25B in the presence of a first depositing atmosphere (SA) for depositing the first semiconductor material S. The first semiconductor material S is deposited within the void 25B to extend along the entire length of the void 25B.

Figure 14:
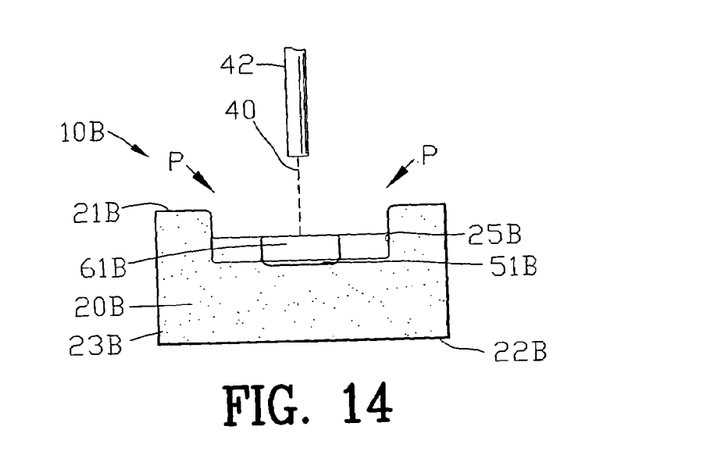
FIG. 14 is a fifth step in the process of forming the semiconductor component of FIG. 3 illustrating a fourth laser beam directed onto the deposited first semiconductor material in the presence of a first doping atmosphere for converting a first portion of the deposited first semiconductor material into a first type of semiconductor.

FIG. 14 is a fifth step in the process of forming the semiconductor component 10B of FIG. 3 illustrating a fourth laser beam directed onto the deposited semiconductor material S for forming a first semiconductor material 61B within the void 25B. The process of forming a first semiconductor material 61B within the void 25B is substantially similar to the process of forming a first semiconductor material 61A within the void 25A shown in FIG. 5.

The process of forming the semiconductor component 10B includes the step of converting a portion of the deposited semiconductor material S into a first type of semiconductor 61B. The step of converting the portion of the deposited semiconductor material S into the first type of semiconductor 61A comprises directing the fourth laser beam 40 into the selected area of the deposited semiconductor material S in the presence of a doping atmosphere P for converting the deposited semiconductor material S into the first type of semiconductor 61B.

The deposited semiconductor material S is doped by directing the laser beam 40 onto the selected portion of the deposited semiconductor material S in the presence of the doping gas P. The laser beam 40 heats the selected portion of the deposited semiconductor material S as well as heating and/or dissociating the doping gas P. The heated and/or dissociated doping gas component P diffuses into the heated selected portion of the deposited semiconductor material S to create a specific type of the doped semiconductor material 61B. In the example of Silicon Carbide, a trimethylaluminum doping gas/vapor the deposited semiconductor material S results in a P-type semiconductor material 61A.

Figure 15:
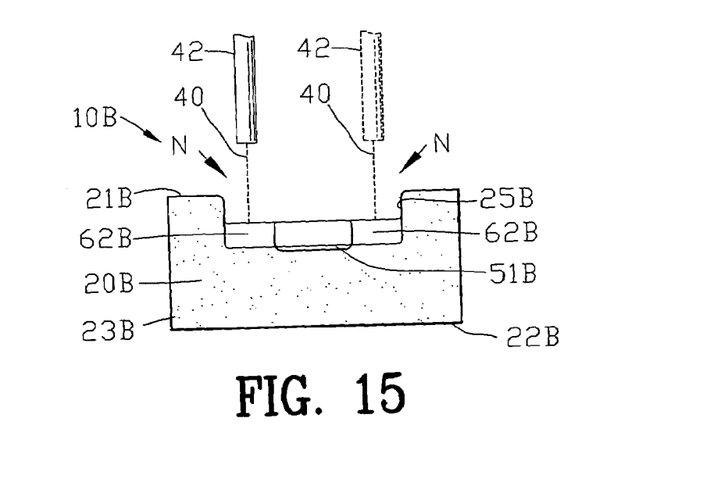
FIG. 15 is a sixth step in the process of forming the semiconductor component of FIG. 3 illustrating a fifth laser beam directed onto the deposited first semiconductor material in the presence of a second doping atmosphere for converting a second portion of the deposited first semiconductor material into a second type of semiconductor.

FIG. 15 is a sixth step in the process of forming the semiconductor component 10B of FIG. 3 illustrating a fifth laser beam directed onto the deposited semiconductor material S for forming a second semiconductor material 62B within the void 25B. The process of forming a second semiconductor material 62B within the void 25B is substantially similar to the process of forming a first semiconductor material 61A within the void 25A shown in FIG. 14.

The process of forming the semiconductor component 10B includes the step of converting portions of the deposited semiconductor material S into a second type of semiconductor 62B. The step of converting the portions of the deposited semiconductor material S into the second type of semiconductor 62A comprises directing the fifth laser beam 40 into the selected areas of the deposited semiconductor material S in the presence of a doping atmosphere N for converting the deposited semiconductor material S into the second type of semiconductor 62B.

The deposited semiconductor material S is doped by directing the laser beam 40 onto the selected portions of the deposited semiconductor material S in the presence of the doping gas N. The laser beam 40 heats the selected portion of the deposited semiconductor material S as well as heating and/or dissociating the doping gas N. The heated and/or dissociated doping gas component N diffuses into the heated selected portion of the deposited semiconductor material S to create a specific type of the doped semiconductor material 62B. In the example of Silicon Carbide, a nitrogen doping gas the deposited semiconductor material S results in a N-type semiconductor material 62A.

Figure 16:
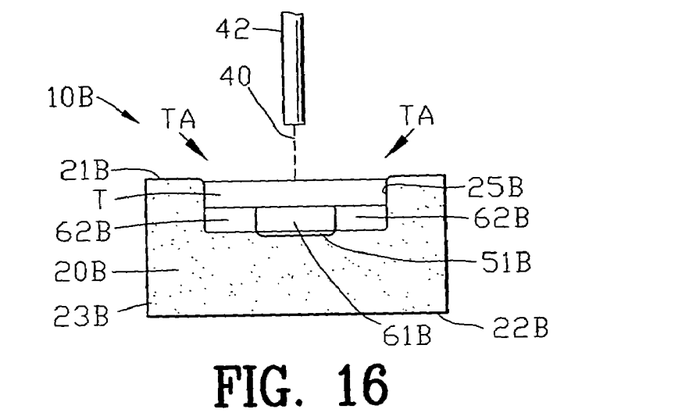
FIG. 16 is a seventh step in the process of forming the semiconductor component of FIG. 3 illustrating a sixth laser beam directed into the void in the presence of a second depositing atmosphere for depositing a second semiconductor material to accumulate within the void.

FIG. 16 is a seventh step in the process of forming the semiconductor component 10B of FIG. 3 illustrating a sixth laser beam 40 directed into the void 25B in the presence of a second depositing atmosphere for depositing addition second semiconductor material T to accumulate within the void 25B.

The step of depositing the second semiconductor material (T) comprises directing a sixth laser beam 40 within the void 25B in the presence of a second depositing atmosphere (TA) for depositing the second semiconductor material T. The second semiconductor material T is deposited within the void 25B to extend along the entire length of the void 25B. The process of depositing the second semiconductor material (T) within the void 25B is substantially similar to the process of depositing the first semiconductor material (S) within the void 25B within the void 25A shown in FIG. 13.

Figure 17:
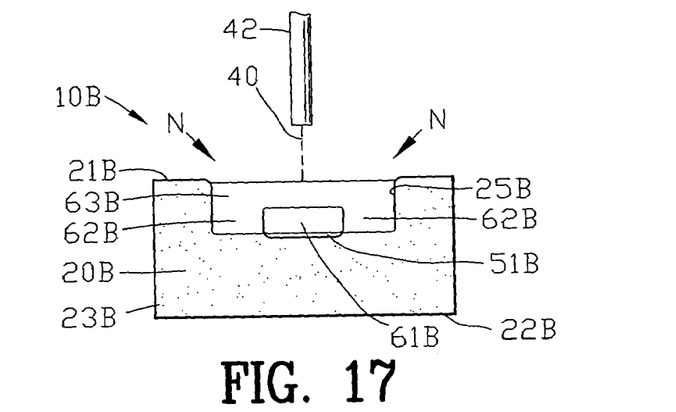
FIG. 17 is an eight step in the process of forming the semiconductor component of FIG. 3 illustrating a seventh laser beam directed onto the deposited second semiconductor material in the presence of a second doping atmosphere for converting a second portion of the deposited second semiconductor material into a second type of semiconductor.
Figure 18:
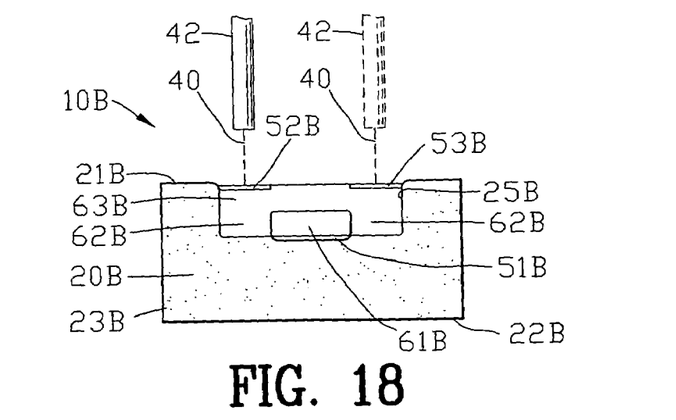
FIG. 18 is a ninth step in the process of forming the semiconductor component of FIG. 3 illustrating an eighth laser beam directed onto the converted second semiconductor material for forming a second and a third conductive element.

FIG. 17 is a eighth step in the process of forming the semiconductor component 10B of FIG. 3 illustrating a seventh laser beam 40 directed onto the second deposited semiconductor material T for forming a second semiconductor material 63B within the void 25B. The process of forming a second semiconductor material 63B within the void 25B is substantially similar to the process of forming a second semiconductor material 62A within the void 25A shown in FIG. 15.

The process of forming the semiconductor component 10B includes the step of converting the second deposited semiconductor material T into a second type of semiconductor 6TB. The step of converting the second deposited semiconductor material T into the second type of semiconductor 63A comprises directing the seventh laser beam 40 into the second deposited semiconductor material T in the presence of a doping atmosphere N for converting the second deposited semiconductor material T into the second type of semiconductor 63B.

Preferably, the step of converting the second deposited semiconductor material T into the second type of the semiconductor 63A established the semiconductor 63A to be identical to the semiconductor 62A.

The completed semiconductor component 10B is shown in FIG. 3. The electrical connectors 71B, 72B and 73B are shown affixed to the first, second and third conductive elements 51B 52B and 53B, respectively. The first conductive elements 51B extends beyond the semiconductor material 61B for facilitating the connection of the electrical connector 71B to the first conductive element 51B. Although the semiconductor component 10B has been shown as a field effect transistor, it should be understood that the present process can be used for fabricating various types of semiconductor component 10B.

The length of the first semiconductor material 61B controls the power handling capacity of the semiconductor component 10B. The length of the first semiconductor material 61B can range from nanometers to any size limited only by the size of the semiconductor substrate 20B. The length of the first semiconductor material 61B may take various geometrical forms such as a linear geometrical form, a curved geometrical form, a serpentine geometrical form and the like. Furthermore, the first semiconductor material 61B may extend on multiple surfaces of the semiconductor substrate 20B.

Figure 19:
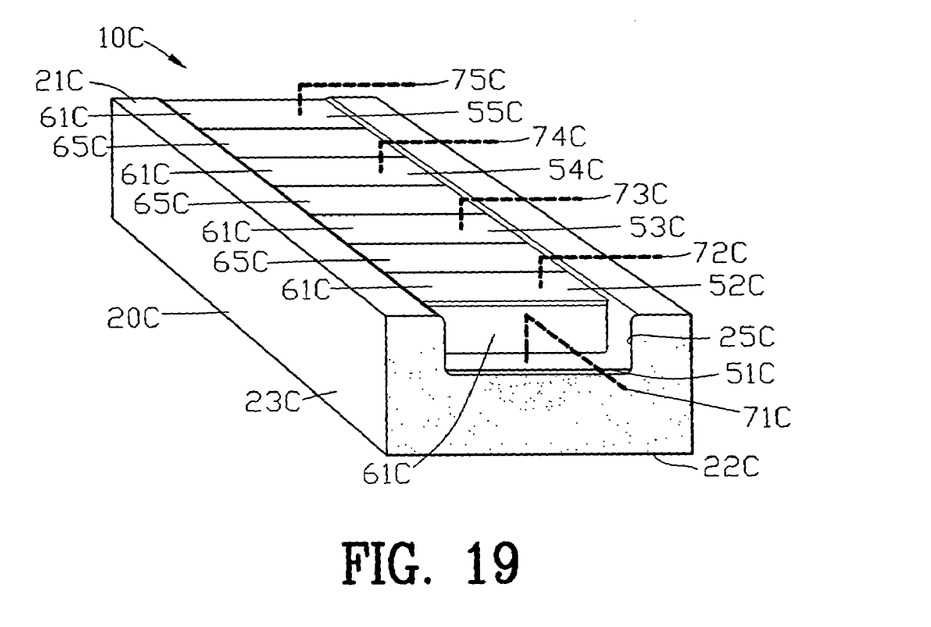
FIG. 19 is an enlarged isometric view of a third example of the an array of semiconductor components formed in the substrate through the process of FIG. 1.

FIG. 19 is an enlarged isometric view of a third example of an array of semiconductor components 10C formed in the substrate 20C through the process of FIG. 1. In this example, the semiconductor component 10C is an array of a nanosize semiconductor diode shown as a Schottky barrier diode. Although the semiconductor component 10C has been shown as a Schottky barrier diode, it should be understood that the present process can be used for fabricating various types of semiconductor component 10C.

The semiconductor substrate 20C defines a first and a second side 21C and 22C and a peripheral edge 23C with the semiconductor component 10C formed within the void 25C. The semiconductor component 10C comprises a plurality of conductive element 51C–55C. A conductive element 51C forms an Ohmic connection with one side of each of the array of the first type of semiconductor material 61C. The conductive elements 52C–55C form barrier junctions with the other side of each of the array of the first type of semiconductor material 61C. An array of insulators 65C is interposed between each of the array of the first type of semiconductor material 61C. An electrical connector 71C is affixed to the conductive element 51C whereas the electrical connectors 71C–75C are affixed to the conductive elements 51C–55C, respectively.

Figure 20:
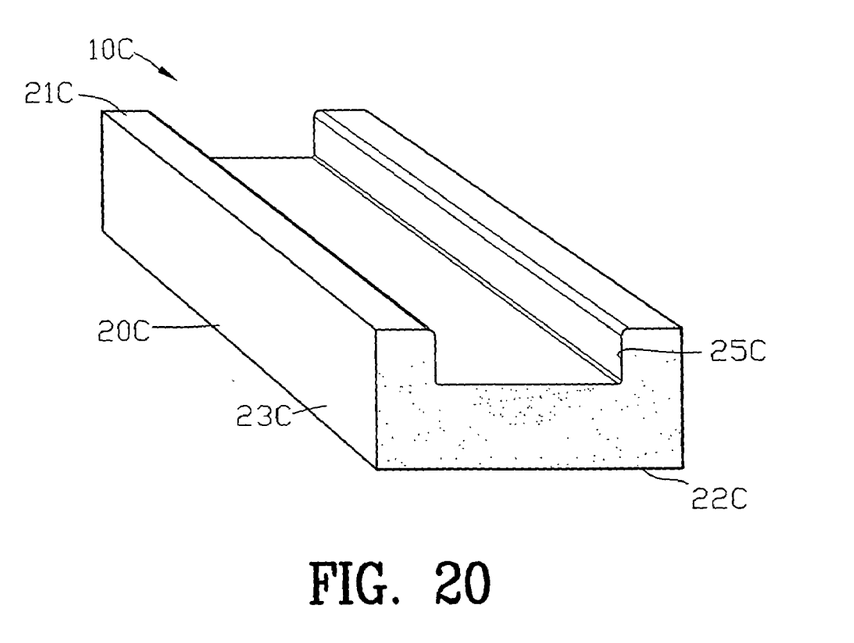
FIG. 20 is a first step in the process of forming the array of semiconductor components of FIG. 19 illustrating the ablation of the substrate to form a void therein.

FIG. 20 is a first step in the process of forming the array of semiconductor components 10C of FIG. 19 illustrating the ablation of the substrate 20C to form a void 25C therein. The process of the ablation of the substrate 20C to form the void 25C is substantially similar to the process of ablation of the substrate 20A shown in FIG. 5.

Figure 21:
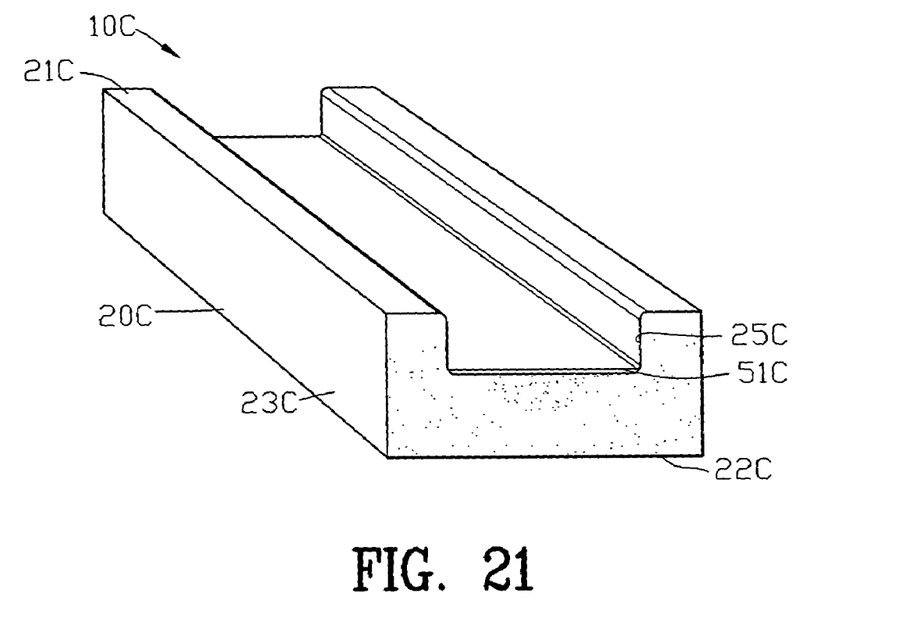
FIG. 21 is a second step in the process of forming the array of semiconductor components of FIG. 19 illustrating the formation of a first conductive element.

FIG. 21 is a second step in the process of forming the array of semiconductor components 10C of FIG. 19 illustrating the formation of a first conductive element 51C. The process of the formation of a first conductive element 51C is substantially similar to the process of the formation of a first conductive element 51A shown in FIG. 6.

Figure 22:
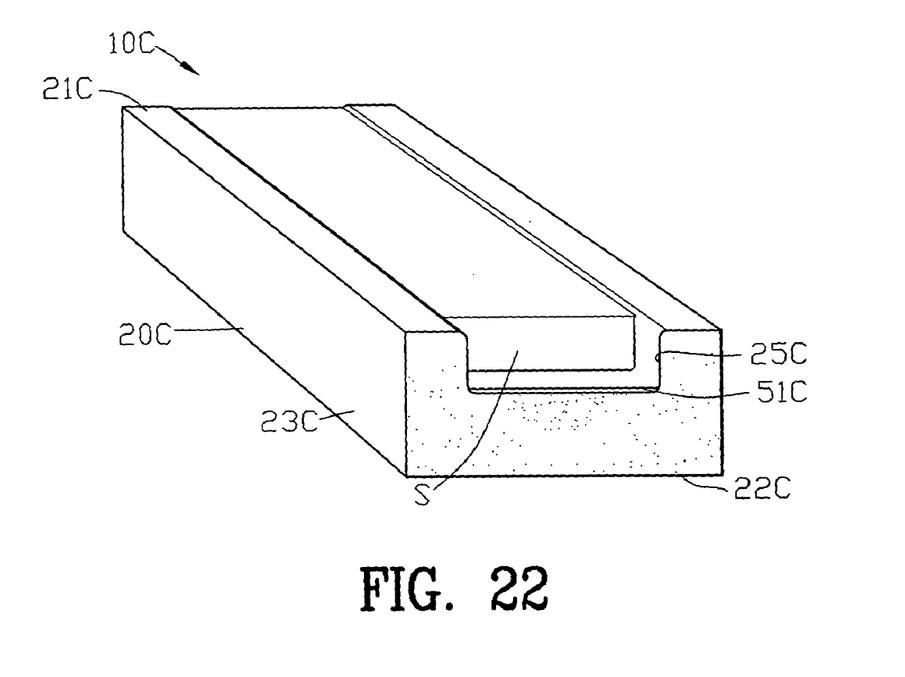
FIG. 22 is a third step in the process of forming the array of semiconductor components of FIG. 19 illustrating the deposition of a semiconductor material within the void.

FIG. 22 is a third step in the process of forming the array of semiconductor components 10C of FIG. 19 illustrating the deposition of a semiconductor material S within the void 25C. The process of the deposition of the semiconductor material S within the void 25C is substantially similar to the process of the deposition of the semiconductor material S within the void 25A shown in FIG. 7.

Figure 23:
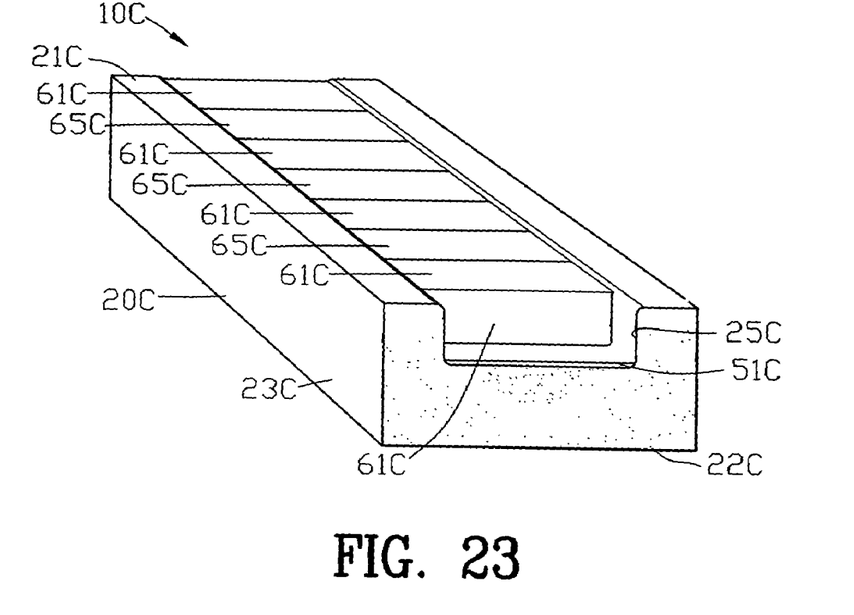
FIG. 23 is a fourth step in the process of forming the array of semiconductor components of FIG. 19 illustrating the conversion of the deposited semiconductor material into alternating bands of a first type of semiconductor and an insulator.

FIG. 23 is a fourth step in the process of forming the array of semiconductor components 10C of FIG. 19 illustrating the conversion of the deposited semiconductor material into alternating bands of a first type of semiconductor 61C and alternating bands of an insulator 65C. The process of the conversion of the deposited semiconductor material into alternating bands of a first type of semiconductor 61C is substantially similar to the process of the formation of conductive element 52A upon the first type of semiconductors 61A shown in FIG. 9. The process of the conversion of the deposited semiconductor material into alternating bands of the insulator 65C is formed in a similar manner in the presence of a suitable doping gas. In the example of silicon carbide, a doping of vanadium, from a metal-organic such as vanadium tris-acetylacetonate, will provide the insulator 65C.

Figure 24:
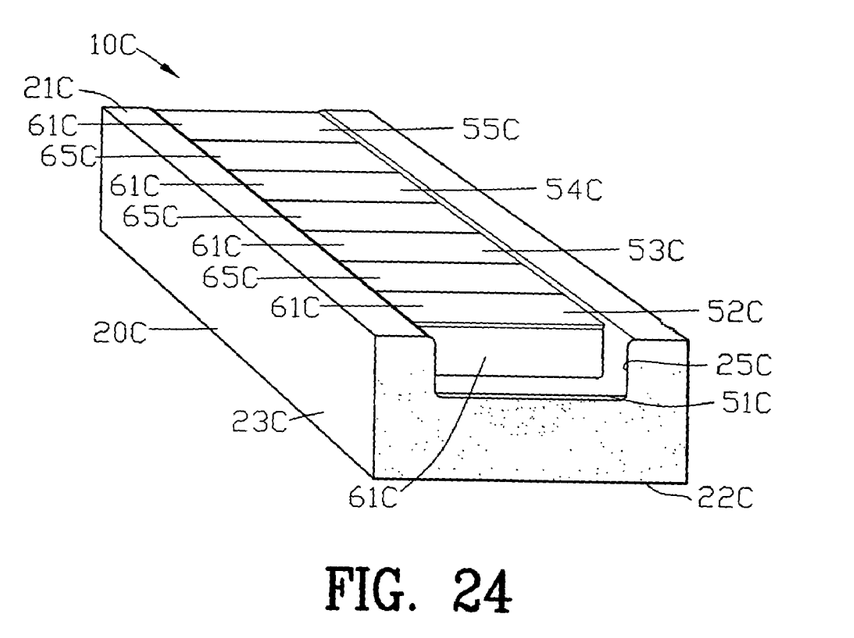
FIG. 24 is a fifth step in the process of forming the array of semiconductor components of FIG. 19 illustrating formation of a conductive element upon the array of the first type of semiconductors.

FIG. 24 is a sixth step in the process of forming the array of semiconductor components 10C of FIG. 19 illustrating formation of conductive element 52C–55C upon the array of the first type of semiconductors 10C. The process of the formation of conductive element 52C–55C upon the array of the first type of semiconductors 61C is substantially similar to the process of the formation of conductive element 52A upon the first type of semiconductors 61A shown in FIG. 9.

The present invention provides an improved process for forming a semiconductor component 10 in the semiconductor substrate 20. The semiconductor component 10 is formed in situ on the semiconductor substrate 20 through the use of a thermal energy beam 40. The semiconductor component 10 is formed by direct conversion of selected areas of the semiconductor substrate 20 through the use of a thermal energy beam 40.

Although the invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. The process of fabricating a semiconductor component in a substrate, comprising the steps of:
   forming a first conductive element in a void of a substrate with a first laser beam;
   depositing a semiconductor material upon the first conductive element with a second laser beam operating in the presence of a depositing atmosphere; and
   forming a second conductive element on the deposited semiconductor material with a third laser beam.

2. The process of fabricating a semiconductor component as set forth in claim 1, wherein the substrate is a single crystal compound.

3. The process of fabricating a semiconductor component as set forth in claim 1, wherein the step of forming a first conductive element in the void includes ablating the substrate with a laser beam to form the void therein.

4. The process of fabricating a semiconductor component as set forth in claim 1, wherein the semiconductor component is a nanosize semiconductor component.

5. The process of fabricating a semiconductor component as set forth in claim 1, wherein the substrate is selected for the group consisting of Aluminum Nitride, Silicon Carbide, Boron Nitride, Gallium Nitride or diamond; and
   the depositing atmosphere is selected for the group consisting of nitrogen gas, trimethylaluminum gas, phosphine gas, di-borane gas, tungsten hexafloride gas, titanium tetra chloride gas, titanium ethoxide gas, aluminum sec-butoxide gas, silane gas and tetra carbonyl nickel gas.

6. The process of fabricating a semiconductor component in a substrate, comprising the steps of:
   directing a first laser beam onto the substrate for ablating the substrate to form a void therein;
   directing a second laser beam within the void for forming a first conductive element;
   directing a third laser beam within the void in the presence of a first depositing atmosphere for depositing a first semiconductor material upon the first conductive element to accumulate within the void with the first semiconductor material; and
   directing a fourth laser beam onto the first semiconductor material for forming a second conductive element.

7. The process of fabricating a semiconductor component as set forth in claim 6, wherein the semiconductor component is a diode.

8. The process of fabricating a semiconductor component as set forth in claim 6, wherein the semiconductor component is a Schottky barrier diode.

9. The process of fabricating a semiconductor component in a substrate, comprising the steps of:
   directing a first laser beam onto the substrate for ablating the substrate to form a void therein;
   directing a second laser beam within the void for forming a first conductive element;

directing a third laser beam within the void in the presence of a first depositing atmosphere for depositing a first semiconductor material upon the first conductive element to accumulate within the void with the first semiconductor material;

directing a fourth laser beam within the void in the presence of a second depositing atmosphere for depositing a second semiconductor material upon the first semiconductor material to accumulate within the void; and directing a fifth laser beam onto the second semiconductor material for forming a second conductive element in electrical contact with the second semiconductor material.

10. The process of fabricating a semiconductor component as set forth in claim 9, wherein the semiconductor component is a transistor.

11. The process of fabricating a semiconductor component as set forth in claim 9, wherein the semiconductor component is a field effect transistor.

12. The process of fabricating a semiconductor component in a substrate, comprising the steps of:

providing a crystalline or polycrystalline wide-bandgap semiconductor substrate responsive to laser conversion;

ablating the semiconductor substrate with a first laser beam to form a void therein;

forming a first conductive element in the void of the substrate with a second laser beam;

depositing a semiconductor material upon the first conductive element with a third laser beam operating in the presence of a depositing atmosphere;

providing a plurality of metallo-organic dopants containing gas/vapor for causing chemical changes in selected areas of the deposited semiconductor material;

converting the deposited semiconductor material to a converted semiconductor material by fourth laser beam in the presence of the metal-organic dopants containing gas/vapors;

forming a second conductive element on the converted semiconductor material with a fifth laser beam.

13. The process of fabricating a semiconductor component as set forth in claim 12, wherein the converted semiconductor converted material is a p-type semiconductor material.

14. The process of fabricating a semiconductor component as set forth in claim 12, wherein the converted semiconductor converted material is an N-type semiconductor material.

15. The process of fabricating a semiconductor component in a substrate, comprising the steps of:

providing a crystalline or polycrystalline wide-bandgap semiconductor substrate that is responsive to laser conversion;

ablating the semiconductor substrate with a first laser beam to form a void therein;

forming a first conductive element in the void of the substrate with a second laser beam;

depositing a first semiconductor material upon the first conductive element with a third laser beam operating in the presence of a depositing atmosphere;

providing a plurality of metal-organic dopants containing gas/vapor for causing chemical changes in selected areas of the deposited semiconductor material;

converting a first portion of the first deposited semiconductor material to a P-type semiconductor material by fourth laser beam in the presence of the metallo-organic dopants containing gas/vapors;

converting a second portion of the first deposited semiconductor material to a N-type semiconductor material by fifth laser beam in the presence of the metallo-organic dopants containing gas/vapors;

depositing a second semiconductor material upon the first deposited semiconductor material;

converting the second deposited semiconductor material to a N-type semiconductor material by sixth laser beam in the presence of the metal-organic dopants containing gas/vapors; and forming a second conductive element on the converted semiconductor material with a seventh laser beam.

* * * * *